United States Patent
Bäuml et al.

(10) Patent No.: US 6,229,420 B1
(45) Date of Patent: May 8, 2001

(54) PROXIMITY SWITCHES WITH MECHANICAL DECOUPLING OF CONNECTION PINS AND CONNECTION INSERT

(75) Inventors: Alfred Bäuml, Wackersdorf; Manfred Schmitt, Hahnbach; Robert Gassner, Amberg, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/194,214

(22) PCT Filed: May 26, 1997

(86) PCT No.: PCT/DE97/01066

§ 371 Date: Nov. 20, 1998

§ 102(e) Date: Nov. 20, 1998

(87) PCT Pub. No.: WO97/47087

PCT Pub. Date: Dec. 11, 1997

(30) Foreign Application Priority Data

Jun. 5, 1996 (DE) .............................................. 196 22 445

(51) Int. Cl.[7] ...................................................... H01H 9/00

(52) U.S. Cl. ............................................................ 335/205

(58) Field of Search ............................ 335/205–7, 151–3

(56) References Cited

U.S. PATENT DOCUMENTS

| | | | |
|---|---|---|---|
| 5,498,651 | * | 3/1996 | Collins .................................. 235/440 |
| 5,508,611 | * | 4/1996 | Schroeder et al. .................... 324/252 |
| 5,789,920 | * | 8/1998 | Gass ...................................... 324/260 |
| 5,803,604 | * | 9/1998 | Pompei ................................. 374/181 |
| 5,878,824 | * | 3/1999 | Mercer et al. ......................... 175/24 |

FOREIGN PATENT DOCUMENTS

| | | |
|---|---|---|
| 92 00 772 | 4/1992 | (DE) . |
| 93 02 714 | 5/1993 | (DE) . |
| 93/15554 | 8/1993 | (WO) . |

* cited by examiner

*Primary Examiner*—Lincoln Donovan
(74) *Attorney, Agent, or Firm*—Kenyon & Kenyon

(57) ABSTRACT

A proximity switch including a connector insert (4) and connection pins (4) are not securely connected to one another. Apart from a potting compound which fills the housing, the connection pins are held only by a printed circuit board. This permits easy assembly, and no forces are transmitted to a sensor element via the printed circuit board.

9 Claims, 4 Drawing Sheets

PROXIMITY SWITCHES WITH MECHANICAL DECOUPLING OF CONNECTION PINS AND CONNECTION INSERT

FIELD OF THE INVENTION

The present invention relates to a proximity switch having a housing, a sensor element, e.g. a pot core with a sensor coil, and a printed circuit board which is embedded in a potting compound in the housing and is electrically connected at one end to the pot core and, at the other end, to connection pins.

BACKGROUND INFORMATION

German Patent No. 92 00 772 describes a conventional proximity switch. Here, the sleeve-shaped housing is provided with a number of bores at the level of a centrally arranged light-emitting diode, in order to make it possible to see the switching state of the proximity switch from all sides. A transparent connector insert extending up to in front of the bores serves as an optical waveguide from the light-emitting diode in the direction of the bores. The connector insert is securely connected to connection pins whose ends are electrically connected directly to the printed circuit board, after having been bent. The connector pins with bent ends can be soldered directly onto the printed circuit board.

SUMMARY OF THE INVENTION

An object of the present invention is to provide a proximity switch which can be assembled without transmission of forces to the pot core via the printed circuit board. In addition, it is an object of the present invention to specify an appropriate production process.

The object is achieved by the fact that the connection pins, apart from the potting compound, are held only by a direct mechanical connection to the printed circuit board, and that a connector insert integrated in the housing surrounds the connection pins without performing a supporting function for them.

An advantageous exemplary embodiment is obtained if the printed circuit board is produced together with the connection pins and the sensor element as a modular switch insert which, apart from the potting compound, is supported in the housing only using the sensor element. This exemplary embodiment proves to be particularly undemanding to assemble, since the switch insert can easily be produced in advance and its use as a module is then made much easier.

Furthermore, it is advantageous if the connector insert has guide means which are used to guide the solder pins during assembly. This technical measure also simplifies assembly. Expediently, the guide means are produced as lugs with bores having a bore diameter which is greater than the thickness of the connection pins.

If the switch insert is embedded in a potting compound in the housing which is produced by potting the housing only once, this reduces the complexity of assembly and at the same time the cost as well.

In order to make it possible to use a light-emitting diode in order to indicate the switching status through an aperture provided in the housing, the connector insert comprises, at least in part, transparent material.

In addition, it is advantageous if the connector insert has a circumferential seal which seals off any gap to the housing in such a manner that it prevents potting compound from escaping through apertures for indicating status.

Another object, of providing a production process for a proximity switch, is achieved by the following process steps:

A cylindrical housing, whose one end opening is covered by a cap, is potted with potting compound to such an extent that a defined interspace remains open between an aperture in the housing, which aperture serves to indicate the switching status, a switch insert assembled as a module from a printed circuit board, connection pins and a sensor element, e.g. a pot core with a sensor coil, is introduced into the uncured potting compound, which displaces some of the potting compound toward the aperture, a connector insert which is partially open at its base is inserted into the housing and displaces potting compound, this potting compound at least partially filling the interspace between the connector insert and the interior wall of the housing.

The process is advantageously improved if, after it has been introduced into the uncured potting compound, the switch insert is supported on the cap, by its own weight only, using the sensor element. This means that no other forces, which may possibly be destructive, act on the sensor element, e.g. the pot core.

DETAILED DESCRIPTION OF THE INVENTION

Figure 1:
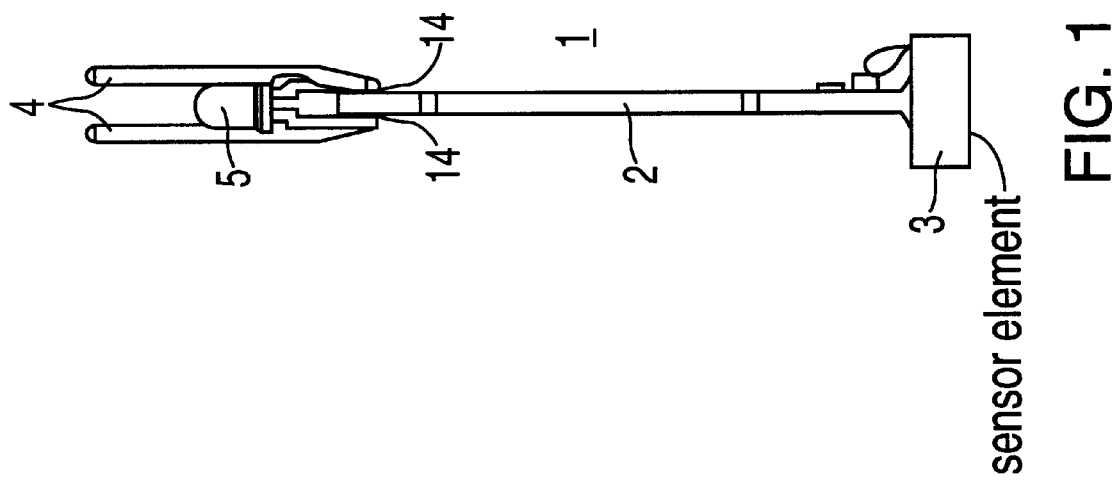
FIG. 1 shows a switch insert assembled as a module.

The proximity switch according to the present invention, in particular an inductive proximity switch, comprises a switch insert 1, shown in FIG. 1. This switch insert 1 comprises a printed circuit board 2, a pot core 3 with a sensor coil as sensor element at one end and solder pins 4, which are connected to the printed circuit board 2 via a direct mechanical connection 14, and a light-emitting diode 5 at the other end.

Figure 2:
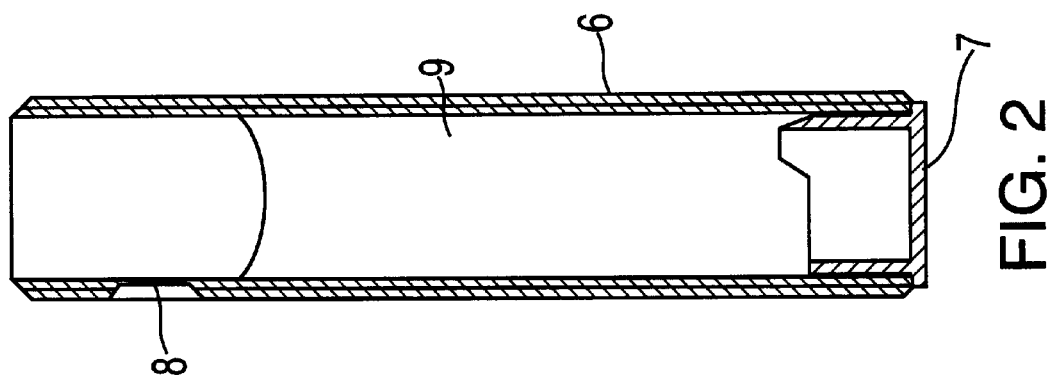
FIG. 2 shows a cylindrical housing for a proximity switch which housing is covered at one end by a cap and is partially filled with potting compound.

FIG. 2 shows a cylindrical housing of a proximity switch according to the present invention whose one end opening is tightly sealed by a cap 7. The housing 6 is filled with a potting compound 9 as far as a defined interspace up to an aperture 8 for a switching status indicator.

Figure 3:
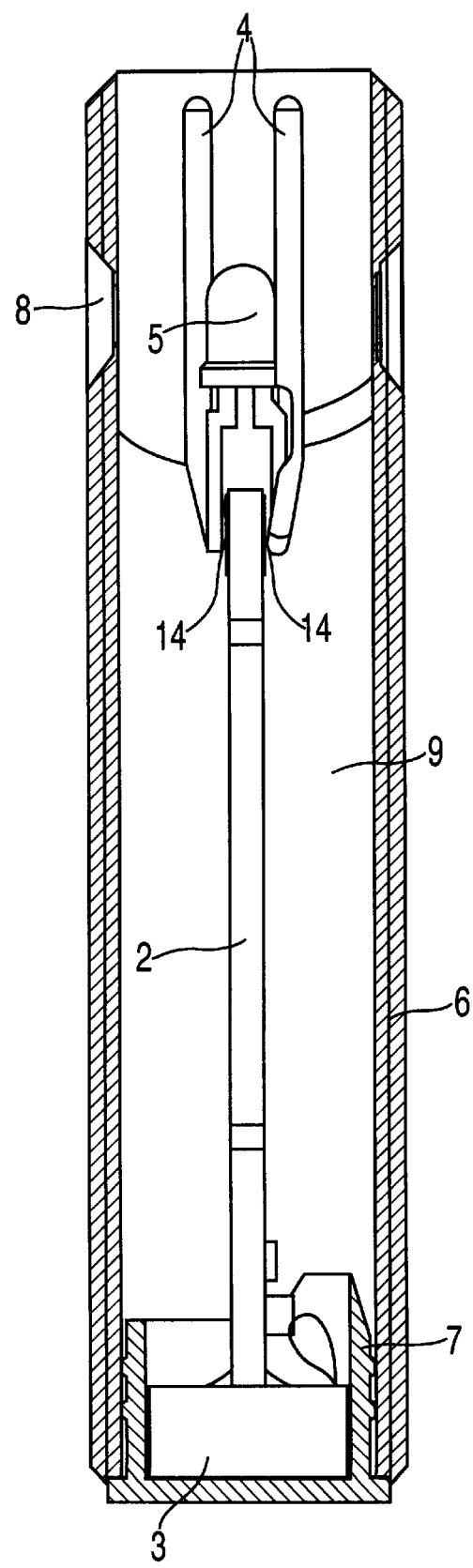
FIG. 3 shows a cylindrical housing as shown in FIG. 2 which has a switch insert as shown in FIG. 1 inserted in it.

FIG. 3 shows an inductive proximity switch including the switch insert 1, shown in FIG. 1, embedded in the potting compound 9, the pot core 3 being supported on the cap 7 and being held additionally by the potting compound only when it has cured. When the switch insert 1 is introduced into the potting compound 9, the latter is displaced toward the aperture 8, as shown in FIG. 3.

Figure 4:
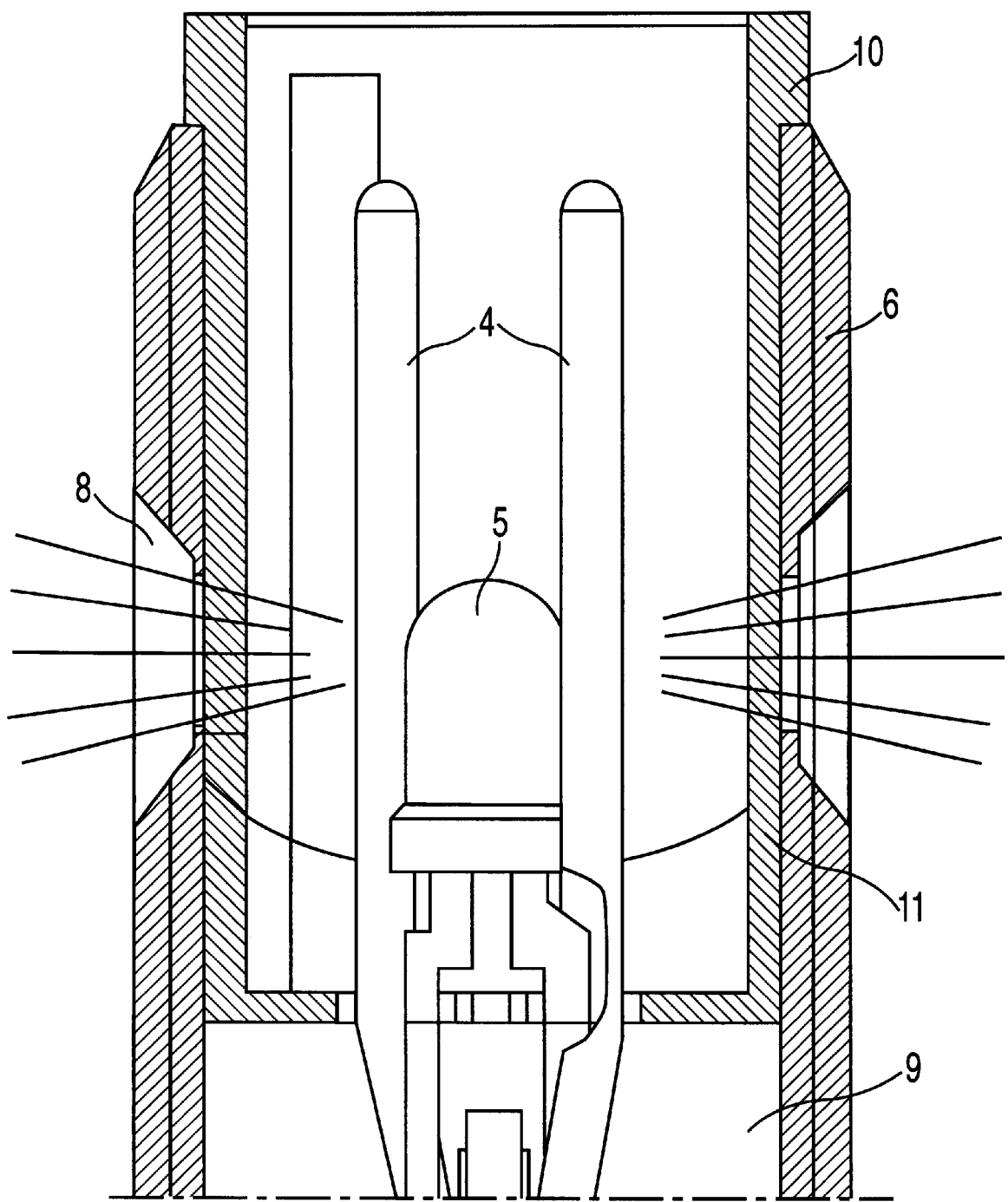
FIG. 4 shows a partial section through the housing in the connection region with an illustration of the connection pins and a connector insert, which are partially embedded in the potting compound.

FIG. 4 shows the connection region of the housing 6, and differs from FIG. 3 in that a connector insert 10 is additionally pushed into the cylindrical housing 6. As shown in FIG.

5, said connector insert has a circumferential seal in the form of a scraper rib 11 which prevents potting compound 9 from escaping through the aperture 8 for indicating status. On its underside, the connector insert 10 is provided with four lugs 12 having half-bores 13 for guiding the connection pins 4. The four lugs 12, in conjunction with the rising potting compound 9 in the interior of the connector, protect the connector insert 10 against tensile and torsional forces.

The light-emitting diode 5 is located outside the potting compound 9, so that the latter does not necessarily have to be transparent. It is only necessary to have a connector insert 10 which is partially transparent toward the aperture 8, in order to ensure that the light-emitting diode 5 indicates the switching status.

Figure 5:
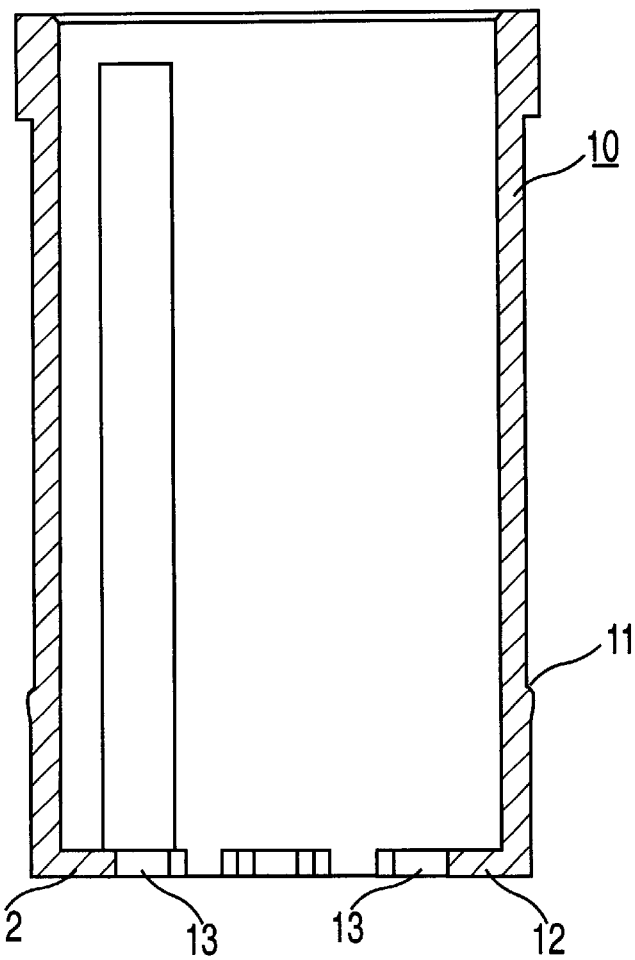
FIG. 5 shows a sectional illustration of the connector insert shown in FIG. 4.
Figure 6:
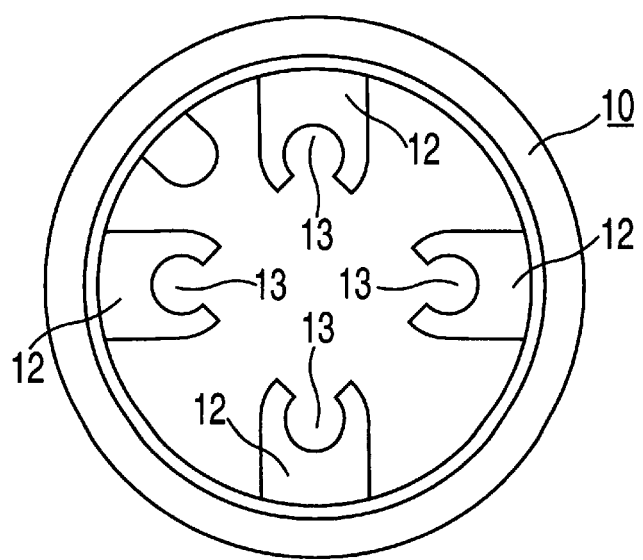
FIG. 6 shows a bottom view of the connector insert shown in FIG. 5.

The individual steps of the production process according to the present invention for the proximity switch described above can be seen in FIGS. 1 to 4. The switch insert 1 which is assembled as a module and shown in FIG. 1 is inserted into the cylindrical housing 6 filled with potting compound 8. Having been inserted, the switch insert 1 is held on the cap 7 in the housing 6 using its pot core 3, as can be seen in FIG. 3. On account of the displacement by the switch insert 1, the boundary surface of the potting compound 9 rises toward the aperture 8. Next, the connector insert 10 shown in FIGS. 5 and 6 is inserted into the cylindrical housing 6, the connection pins 4 being guided via half-bores 13 on the connector insert 10. The scraper rib 11 likewise pushes back potting compound 9 on the interior wall of the housing 6, and thus prevents potting compound 9 from escaping through the aperture 8.

The assembly of the proximity switch is characterized in that no forces are transmitted to the pot core 3 via the electrical circuit, i.e. via the printed circuit board 2. This is because the connection pins 4 are not held by a mechanical connection 14 to the connector insert 10, but by the printed circuit board 2. This results in decoupling of the mechanical connection between the connector insert 10 and the connection pins 4. A further significant advantage is that the production process now requires only a single potting operation.

Although the present invention is explained with reference to the exemplary embodiment shown in FIGS. 1–5, it should be noted that this is not intended to restrict the present invention only to the exemplary embodiment illustrated, but rather to include all possible changes, modifications and equivalent arrangement.

What is claimed is:

1. A proximity switch, comprising:
   a housing at least partially filled with a potting compound;
   a printed circuit board embedded in the potting compound;
   a sensor element electrically and mechanically coupled to a first end of the printed circuit board;
   connection pins electrically and mechanically coupled to a second end of the printed circuit board, the connection pins being held only by:
   (1) the potting compound, and
   (2) a direct mechanical connection to the printed circuit board; and
   a connector insert inserted in the housing, the connector insert surrounding the connection pins without touching the connection pins.

2. The proximity switch according to claim 1, wherein the sensor element includes a pot core.

3. The proximity switch according to claim 1, wherein the proximity switch includes an inductive proximity switch.

4. The proximity switch according to claim 1, wherein the printed circuit board, the connection pins, and the sensor element together form a modular switch insert, the modular switch insert being supported in the housing only by the potting compound and the sensor element.

5. The proximity switch according to claim 1, wherein the connector insert includes a guide arrangement configured to guide the connection pins during an assembly procedure.

6. The proximity switch according to claim 5, wherein the guide arrangement includes lugs having bores, a diameter of each of the bores being greater than the thickness of the connection pins.

7. The proximity switch according to claim 4, wherein the modular switch insert is embedded in the potting compound, the housing being Dotted with the potting compound only once.

8. The proximity switch according to claim 1, wherein the connector insert is at least partially composed of a transparent material.

9. The proximity switch according to claim 1, wherein the connector insert includes a circumferential seal sealing a gap to the housing, the circumferential seal configured to prevent the potting compound from escaping through at least one aperture of the housing during assembly of the proximity switch, the at least one aperture for indicating status.

* * * * *